United States Patent
Kugel et al.

(10) Patent No.: US 8,918,749 B2
(45) Date of Patent: Dec. 23, 2014

(54) INTEGRATED CIRCUIT SCHEMATICS HAVING IMBEDDED SCALING INFORMATION FOR GENERATING A DESIGN INSTANCE

(71) Applicant: International Business Machines Corporation, Armonk, NY (US)

(72) Inventors: Michael Kugel, Boeblingen (DE); Stefan Payer, Nurtingen (DE); Raphael Polig, Dietikon (CH); Tobias Werner, Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/073,009

(22) Filed: Nov. 6, 2013

(65) Prior Publication Data

US 2014/0130004 A1    May 8, 2014

(30) Foreign Application Priority Data

Nov. 7, 2012 (GB) .................................. 1220087.9

(51) Int. Cl.
*G06F 17/50* (2006.01)
(52) U.S. Cl.
CPC .................................. *G06F 17/5072* (2013.01)
USPC ............................ 716/122; 716/110; 716/119
(58) Field of Classification Search
USPC .......................................... 716/110, 119, 122
See application file for complete search history.

(56) References Cited

U.S. PATENT DOCUMENTS

| | | | |
|---|---|---|---|
| 6,219,822 B1 | 4/2001 | Gristede et al. | |
| 7,409,651 B2 * | 8/2008 | Berger et al. | 716/103 |
| 7,761,820 B2 * | 7/2010 | Berger et al. | 716/122 |
| 7,783,995 B2 | 8/2010 | Joshi | |
| 7,882,463 B2 | 2/2011 | Heng et al. | |
| 2005/0125748 A1 | 6/2005 | Gray et al. | |
| 2009/0326873 A1 | 12/2009 | Wang et al. | |
| 2011/0054658 A1 | 3/2011 | Wann | |

OTHER PUBLICATIONS

Levi et al.,"A CMOS Resizing Methodology for Analog Circuits", 2009, IEEE, Design & Test of Computers, Papers, vol. 26, iss. 1, pp. 78-87.*
Galup-Montoro ert al., "Resizing Rules for MOS Analog-Design Reuse", Apr. 2002, IEEE Design & Test of Computers (19:2), pp. 50-58.*
Graeb et al., "The Sizing Rules Method for Analog Integrated Circuit Design", 0-7803-7247-6/01, 2001 IEEE, pp. 343-349.*

(Continued)

*Primary Examiner* — Sun Lin
(74) *Attorney, Agent, or Firm* — Kenneth R. Corsello; H. Daniel Schnurmann (57) ABSTRACT

A non-transitory computer-readable memory including first data representative of a topology of a circuit including a first circuit element and a second circuit element, and second data representative of a scaling rule for the first circuit element as a function of the second circuit element. A data processing method comprising retrieving first data representative of a topology of a circuit comprising a first circuit element and a second circuit element from a memory, retrieving second data representative of a scaling rule for the first circuit element as a function of the second circuit element from the memory, receiving a user input representative of a scaling factor, generating third data representative of an instance of the second circuit element using the scaling factor, and generating data representative of an instance of the first circuit element using the scaling factor, the scaling rule and the third data.

6 Claims, 5 Drawing Sheets

(56) References Cited

OTHER PUBLICATIONS

Funaba et al., "A Fast and Accurate Method of Redesigning Analog Subcircuits for Technology Scaling" Dec. 2000, IEICE Transactions on Analogy Integrated Circuits and Signal Processing, vol. 25, pp. 299-307.*

Savio et al., "Scaling Rules and Parameters Tuning Procedure for Analog Design Reuse in Technology Migration", May 2004, IEEE Proceedings of International Symposium on Circuits and Systems, vol. 5, pp. V-117-V-120.*

Walker, et al., "Optimizing Electric Standard Cell Libraries for Variability Tolerance Through the Nano-CMOS Grid", Philosophical Transactions of the Royal Society A: Mathematical, Physical and Engineering Sciences, http://rsta.royalsocietypublishing.org/content/368/1925/3967.abstract, Jan. 27, 2012.

IEEE Xplore—Abstract Page, vol. 26 Issue 1 "A CMOS Resizing Methodology for Analog Circuits", http://ieeexplore.ieee.org/xpl/login.jsp?tp=&arnumber=4760119&url=http: . . . , Jan. 27, 2012.

IEEE Xplore—Abstract Page, vol. 53 Issue 12 "Automatic Scaling Procedures for Analog Design Reuse", http://ieeeplore.ieee.org/xpl/login.jsp?tp=&arnumber=4026697&url=http . . . , Jan. 27, 2012.

IEEE Xplore—Abstract Page, "Device and Circuit Interactive Design and Optimization beyond the Conventional Scaling Era", http://ieeeplore.ieee.org/xpl/login.jsp?tp=&arnumber=5703380&url=http . . . , Jan. 27, 2012.

* cited by examiner

INTEGRATED CIRCUIT SCHEMATICS HAVING IMBEDDED SCALING INFORMATION FOR GENERATING A DESIGN INSTANCE

FIELD OF THE INVENTION

The present invention includes a data processing method and a data processing system related to schematics having imbedded data representative of scaling rules applicable to the topology and layout of a circuit design.

BACKGROUND

Very Large Scale Integrated circuits (IC) have been designed using a variety of tools including netlists, topology of the IC, and schematic databases, where a representation thereof is commonly referred to as a "schematic." A (design) instance (commonly termed a "layout") of such an integrated circuit may be generated using the schematic. The layout specifies the location and the individual configuration of each circuit element of the integrated circuit and their interconnections. Typically, the layout is designed to minimize substantially the overall size of the circuit. However, the degree to which the size of circuit elements can be reduced depends strongly on the manufacturing process that is used to manufacture the circuit. Due to the dependency on the manufacturing process, customized layouts may be generated for each manufacturing process that "scale" the circuit to the respective process. As such, the manufacturing process for which a layout was designed is commonly referred to as the "scale" of the circuit/layout.

Similarly, a layout of a circuit may be redesigned (e.g., for the sake of improving the timing, i.e., the maximum operating frequency, of the manufactured circuit). While both the initial layout and the redesigned layout can be designed for the same manufacturing process, the redesigning can comprise changing the size of individual circuit elements. As such, such a redesign may be referred to as "scaling" of a circuit.

SUMMARY

In an embodiment, a method is provided that reduces the amount of human intervention necessary to optimize the layout of the IC at the respective scale. This is achieved by complementing a schematic with data representative of scaling rules, for example scaling rules for individual elements of the circuit. The scaling rules can include rules to be obeyed during scaling of the circuit as well as rules specifying a scaling behavior of a first circuit element as a function of a second circuit element.

In another aspect, an embodiment provides a method for creating a data structure representing the topology of the IC and of a plurality of scaling rules, e.g., scaling rules for individual elements of the circuit. Moreover, the data structure can be created by designers that design the topology that includes a method for generating a layout at a given scale using the topology and the scaling rules stored in such a data structure. Due to improvements to manufacturing processes over time, it is not uncommon that the layout of the circuit to be "redesigned" for a new process (i.e., at a new scale) several years after the circuit topology was designed. As such, the embodiment reduces the amount of human intervention necessary to optimize the layout by allowing design considerations known to professionals who designed the topology to be carried over in time and to be duly respected during creation of a layout in a manner that is visible/comprehensible having been tweaked by the layout designers.

In another aspect, in one embodiment, the method can include storing data representing the topology of the circuit, e.g., data representative of a schematic of a circuit. The circuit can be part and parcel of an integrated circuit, typically having hundred thousand circuit elements extending to millions circuit elements or tens of millions circuit elements. For example, the circuit can be part of an integrated circuit including on the order of 50 to 100 different circuit topologies, each of the circuit topologies including on the order of 20 to 50 or 20 to one hundred circuit elements. The integrated circuit can contain multiple instances of each circuit topology. As such, the circuit can include a first circuit element and a second circuit element. The circuit can include circuit elements belonging to the group of transistors, resistors, capacitors and wires. The wires can electrically interconnect respective (input/output pins of) other circuit elements. The circuit can include circuit elements belonging to the group of resistances inherent to a transistor, capacitances inherent to a wire, inductances inherent to a wire and capacitances inherent to a transistor.

The data can include data representative of any of the circuit elements of the circuit. For example, the data can include data representative of an element type (e.g., resistance, transistor, capacitance, and the like) of any of the circuit elements. Similarly, the data can include data representative of any input/output pins of any ones of the circuit elements. Likewise, the data can further include data representative of any interconnections between respective input and output pins of any of the circuit elements.

The method can include storing data representative of a scaling rule. The scaling rule can apply to one or more circuit elements of the circuit. The scaling rule can be a scaling rule for the first circuit element, e.g., a scaling rule for the first circuit element as a (linear or non-linear) function of the second circuit element. The scaling rule can specify (a rule for) a parameter of the first circuit element, e.g., as a function of a parameter of the second circuit element. The parameters can be parameters other than location. The data can include, for each of a plurality of the circuit elements, a respective (individual) scaling rule for the respective circuit element.

The scaling rule can be selected from the group consisting of a scaling rule for a capacitance as a function of a load, a scaling rule for a resistance as a function of a transistor, a scaling rule for a transistor as a function of a resistance and a scaling rule for a transistor as a function of another transistor.

The scaling rule can specify a width of a gate channel of a transistor as a function of the width of the gate channel of another transistor. Such a scaling rule can ensure that the current flowing through one transistor is larger than the current flowing through another transistor, thus preserving functionality of the circuit as the circuit is scaled.

Similarly, the scaling rule can specify a capacitance of a wire as a function of (a gate channel of) a transistor. As such, the scaling rule can ensure that a change in capacitance that can arise as a transistor and its i.e., connecting wires, referenced as "fingers") are scaled is properly considered during design of the layout. Similarly, the scaling rule can specify a capacitance of a wire as a function of (e.g., a size/area of) a source/drain (diffusion zone) of a transistor.

Likewise, the scaling rule can specify a capacitance of a wire as a non-linear function of a load, e.g., a load imposed by a portion of the circuit or a design load to be driven by the circuit. The scaling rule can specify a capacitance at each of a plurality of loads and the capacitance at a load between any two of the plurality loads can be a linear interpolation of the capacitance at the two loads.

Furthermore, the scaling rule can specify an inherent resistance of a transistor as a function of a parameter of the transistor. For example, the scaling rule can specify an inherent resistance intermediate such as a diffusion contact forming a source/drain/gate of a transistor and wires of a metallization layer that supplies/receives a signal to/from the source/drain/gate. The inherent resistance can be specified as a function of a resistance of vias connecting the source/drain to the metallization layer. The size and/or number of vias, and thus the resistance of the vias, can be a function of a size of the transistor and/or a function of the size of the wires in the metallization layer.

Similarly, the scaling rule can specify a parameter of a transistor as a function of a resistance. For example, the scaling rule can specify the number of vias connecting (a diffusion contact forming) a source/drain/gate of the transistor as a function of an inherent resistance of the vias. The function can stipulate that the number of vias be increased if the resistance exceeds a given (threshold) resistance. The function can stipulate that the number of vias be reduced if the resistance is less than a given (threshold) resistance. Likewise, the function can stipulate that the number of wires (also referred to as "fingers") supplying/receiving signals from the source/drain/gate be increased if the resistance exceeds a given (threshold) resistance. The function can stipulate that the number of "fingers" supplying/receiving signals from the source/drain/gate be reduced if the resistance is less than a given (threshold) resistance.

The scaling rule can specify a minimum/maximum transistor size, e.g., specify a minimum/maximum gate width for one or more transistors. Similarly, the scaling rule can specify a minimum/maximum size of one or more wires, each of which wires interconnects (input/output pins of) a plurality of circuit elements.

The scaling rule can specify whether the scaling rule is to have global or local effect. For example, the scaling rule can specify that further downscaling of the entire topology is prevented as soon as any circuit element (to which the scaling rule applies) reaches a specified minimum size. Similarly, the scaling rule can specify that further up scaling of the entire topology is prevented as soon as any circuit element (to which the scaling rule applies) reaches a specified maximum size. Such behavior can be deemed global. In a local sense, the scaling rule can specify that further downscaling/up scaling of a respective, individual circuit element (to which the scaling rule applies) is reaches prevented as soon as the respective circuit element reaches a specified minimum/maximum size. The (first and/or second) data can be stored to a memory, e.g., to a computer memory.

The method can include storing data including an identifier and data representative of a location of the first data and the second data in the memory. For example, the first data and the second data can be stored in a common file, the common file having a file identifier, e.g., a file name. The common file can include information specifying a location of the first data and the second data within the file. As such, the third data can be such a common file. Similarly, the third data can be a file having a file identifier, (e.g., a file name). The file can include information specifying a file identifier of a file including the first data and a file identifier of a file including the second data. The file identifiers can allow the respective files to be located in memory and can thus be representative of a location of the respective files, i.e., of the respective data. The third data can likewise be stored to a memory, e.g., to a computer memory.

The method can include receiving a user input representative of a parameter of the scaling rule. The method can include storing the user input and/or modifying the stored second data to include the user input. For example, the method can include receiving a user input specifying that a width of a gate channel of a transistor must be at least three times larger than a width of a gate channel of another transistor.

The method can include retrieving data representative of a topology of a circuit, e.g., data representative of a schematic of a circuit. The circuit can be a circuit as previously described, e.g., a circuit including a first circuit element and a second circuit element. The data can represent the circuit as previously described. The data can be retrieved from a memory, e.g., a computer memory.

The method can include retrieving data representative of a scaling rule, e.g., a scaling rule as previously described. The data can be retrieved from a memory, e.g., from a computer memory.

The method can include receiving a user input representative of a scaling factor. For example, the scaling factor can indicate that the circuit is to be scaled to a particular process. In other words, the scaling factor can indicate a process via which the circuit is to be mass manufactured and for which a layout of the circuit is to be created/designed. Similarly, the scaling factor can indicate a size of one or more circuit elements or of a portion of one or more circuit elements. For example, the scaling factor can specify a width of a gate channel of a group of transistors, an area of a drain diffusion zone of a transistor, a "gridding" of wires in a metallization layer, and the like. As such, the scaling factor can be a number.

The method can include generating data representative of an instance of any of the circuit elements of the circuit, e.g., of another circuit element. For example, the data can be representative of a layout of any of the circuit elements of the circuit. The generating can be effected using the user input and/or the scaling factor. For example, the data can be representative of a layout of the circuit suitable for manufacturing the circuit using a manufacturing process specified by the user. The data can specify the location and/or the individual configuration of any of the circuit elements of the circuit. For example, the data can specify a location, a length and a width of one or more wire segments. Similarly, the data can specify a location and a gate width of one or more transistors.

The method can include generating data representative of an instance of any of the circuit elements of the circuit, e.g., of the first circuit element. The generating can be effected using the user input and/or the scaling factor. Similarly, the generating can be effected using a scaling rule for the respective circuit element, e.g., using a scaling rule for the first circuit element. Furthermore, the generating can be effected using the fourth data. For example, the fourth data can include data representative of an instance of the second circuit element and the fifth data can include data representative of an instance of the first circuit element generated using a scaling rule for the first circuit element and the data representative of an instance of the second circuit element.

For example, the first circuit element and the second circuit element can be a transistor and the scaling rule for the first circuit element can specify that the gate width of the first circuit element should be at least twice as wide as the gate width of the second circuit element. The fifth data for the first circuit element can then be generated accordingly using the fourth data, i.e., such that the gate width of the first circuit element is at least twice as wide as the gate width of the second circuit element.

The method can include generating fourth data representative of an instance of the second circuit element using the scaling factor and generating fifth data representative of an instance of the first circuit element using the fourth data and a scaling rule for the first circuit element. The method can include generating sixth data representative of another instance of the second circuit element using the fifth data, the scaling factor and a scaling rule for the second circuit element.

For example, the second circuit element can be a transistor and the first circuit element can be an inherent resistance of that transistor, e.g., a resistance intermediate (a diffusion contact forming) a source/drain/gate of the transistor and (wires of) a metallization layer that supplies/receives a signal to/from the source/drain/gate of the transistor. In a first step, an instance of the transistor can be generated using the scaling factor. In a second step, a resistance value of an inherent resistance of the transistor can be calculated using the scaling rule (for the resistance, e.g., that specifies a value of the resistance as a function of one or more parameters of the transistor) and the generated instance of the transistor. For example, the resistance can be a function of the number of "fingers" the transistor has as well as a function of the size of the vias connecting the source/drain/gate of the transistor to the metallization. In a third step, the number of "fingers" can be adapted in response to the value of the resistance. For example, a scaling rule for the transistor can specify that the number of "fingers" is to be increased if the inherent resistance (specified by the fifth data) between the drain/source/gate and the metallization exceeds a maximum value. The number of "fingers" can then be increased in keeping with the scaling factor (that can imply a maximum size for the individual fingers and/or a gridding distance between the individual fingers).

The method can include retrieving data from a memory, e.g., third data as described above. As such, the retrieved data can include an identifier and/or data representative of a location of first data (e.g., first data as described above) and second data (e.g., second data as previously described) in the memory. The aforementioned retrieving of data representative of a topology of a circuit can use the retrieved data to locate the data in the memory. Similarly, the aforementioned retrieving of data representative of a scaling rule can use the retrieved data to locate the data in the memory. For example, the data can be retrieved by comparing a given identifier with an identifier in the data and retrieving the identifier if the given identifier matches the identifier in the data. The location data in the data then allows a circuit schematic/topology and associated scaling rules to be retrieved.

While the teaching of the present disclosure have been previously described mainly in the form of a method, the teachings can be embodied in the form of a tangible, computer-readable memory, e.g., in the form of a memory storing data as previously described.

Similarly, the above teachings can be embodied in the form of a system, e.g., a data processing system, or a computer program product, as will be appreciated by the person skilled in the art.

The system can be configured and adapted to affect any of the actions described above with respect to the disclosed method. For example, the system can include a control component that affects any of the actions described above with respect to the disclosed method.

The system can include a data receiver that receives data as previously described. It can include a memory that stores data as previously described, e.g., a tangible, computer-readable memory, and further, include a user input receiving component that receives user inputs as previously described. Moreover, the system can include a processor that processes data, e.g., modifies and/or generates data, as previously described and/or instigates any of the actions previously described.

Any of the aforementioned components of the system can communicate with any other of the aforementioned components of the system. In this respect, the system can include one or more communication busses/links interconnecting the respective components.

DETAILED DESCRIPTION

Figure 1:
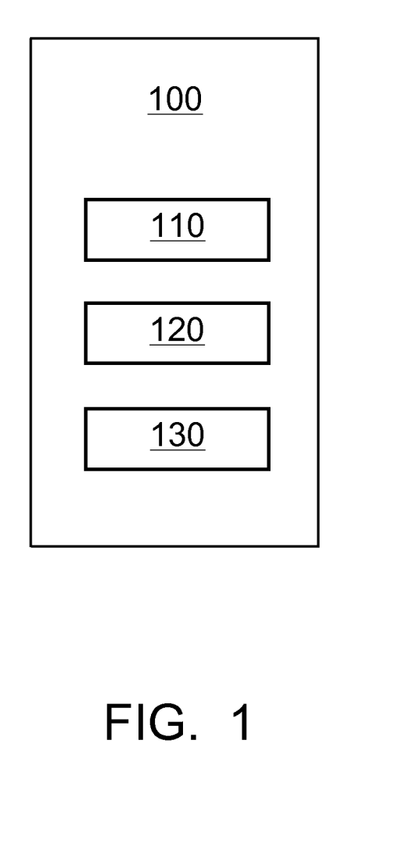
FIG. 1 schematically shows an embodiment of a computer-readable memory in accordance with the present disclosure.

FIG. 1 schematically shows an embodiment of a computer-readable memory in accordance with the present disclosure, e.g., as described above.

In the embodiment, computer-readable memory 100 includes first data 110 representative of a topology of a circuit, second data 120 representative of a scaling rule and optional third data, which third data includes an identifier and data representative of a location of the first data and the second data in the memory.

Figure 2:
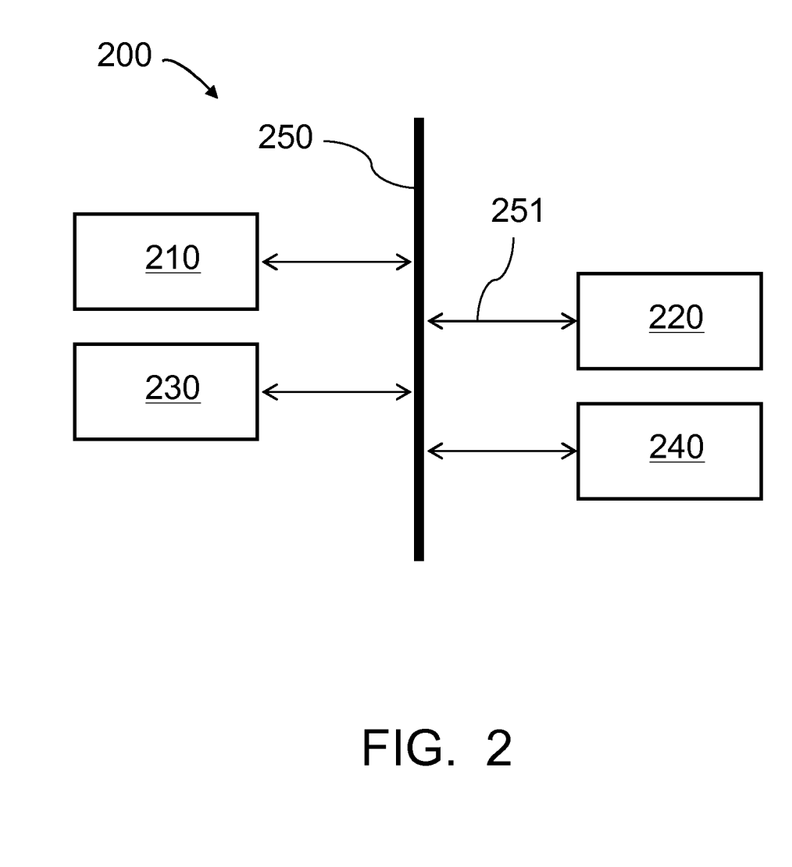
FIG. 2 schematically shows an embodiment of a data processing system in accordance with the present disclosure.

FIG. 2 schematically shows an embodiment of a data processing system 200 in accordance with the present disclosure, e.g., as previously described.

In one embodiment, data processing system 200 includes a data receiver 210, a memory 220, a user input device 230, a processor 240 as well as a communication bus 250 including a plurality of communication links 251 (for the sake of legibility, only one of the communication links bears a reference sign). Communication bus 250 and the communication links 251 communicatively interconnect the aforementioned components 210-240.

Figure 3:
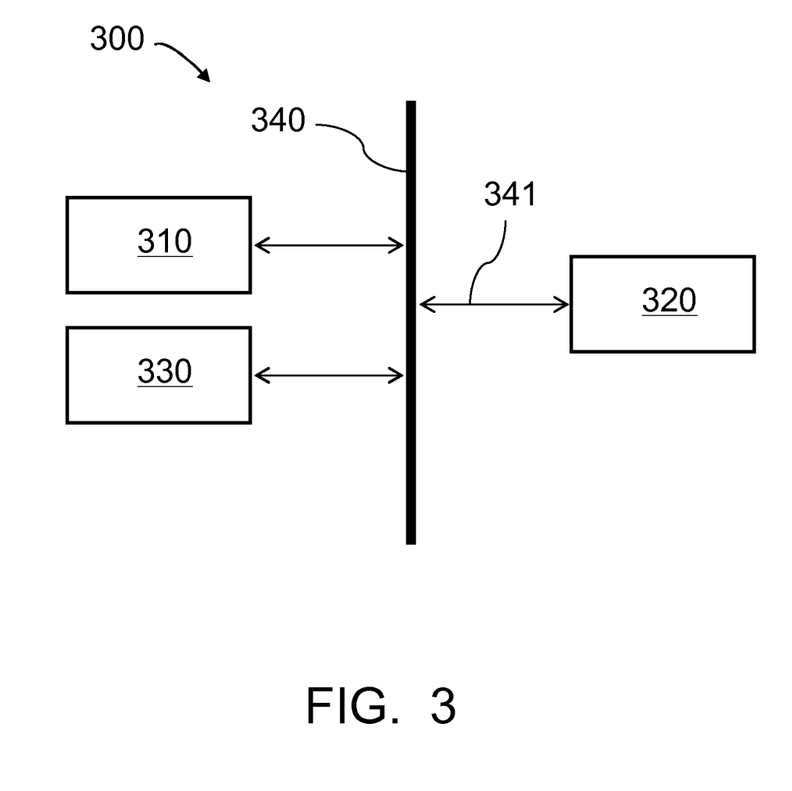
FIG. 3 schematically shows another embodiment of a data processing system in accordance with the present disclosure.

FIG. 3 schematically shows an embodiment of a data processing system 300 in accordance with the present disclosure, e.g., as described above.

In an embodiment, data processing system 300 includes a memory 310, a user input device 320, a processor 330 as well as a communication bus 340 including a plurality of communication links 341 (for the sake of legibility, only one of the communication links bears a reference sign). Communication bus 340 and the communication links 341 communicatively interconnect the aforementioned components 310-330.

Figure 4:
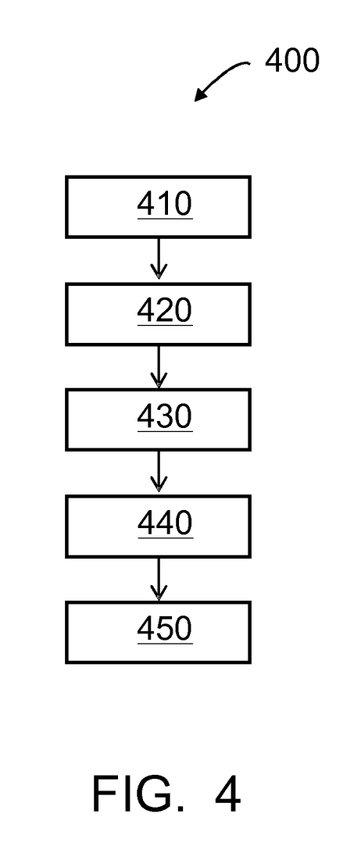
FIG. 4 schematically shows a flow diagram of an embodiment of a data processing method in accordance with the present disclosure.

FIG. 4 schematically shows a flow diagram 400 of an embodiment of a data processing method in accordance with the present disclosure, e.g., as described above.

In an embodiment, flow diagram 400 includes a step 410 of storing first data representative of a topology of a circuit, a step 420 of storing second data representative of a scaling rule, an optional step 430 of storing third data including an identifier and data representative of a location of the first data and the second data in a memory, an optional step 440 of receiving a user input representative of a parameter of the scaling rule and an optional step 450 of modifying the stored second data to include the parameter.

Figure 5:
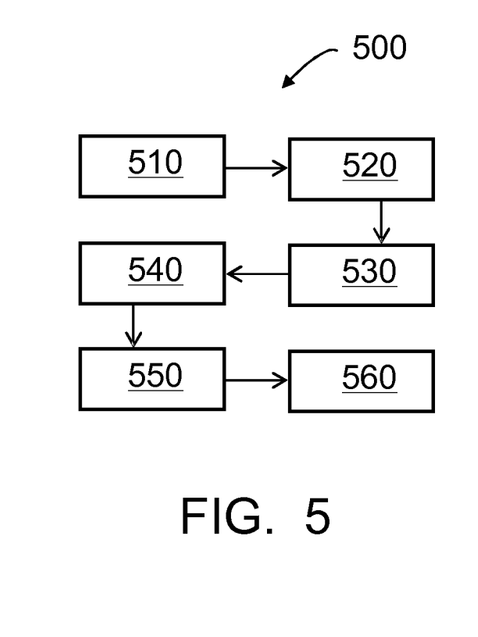
FIG. 5 schematically shows a flow diagram of another embodiment of a data processing method in accordance with the present disclosure.

FIG. 5 schematically shows a flow diagram 500 of another embodiment of a data processing method in accordance with the present disclosure, as previously described.

In the embodiment, flow diagram 500 includes a step 510 of retrieving first data representative of a topology of a circuit including a first circuit element and a second circuit element, a step 520 of retrieving second data representative of a scaling rule, a step 530 of receiving a user input representative of a scaling factor, a step 540 of generating fourth data representative of an instance of the second circuit element, a step 550 of generating data representative of an instance of the first circuit element and an optional step 560 of retrieving third data from a memory, the third data including an identifier and data representative of a location of the first data and the second data in the memory.

Further embodiments will be described with reference to FIGS. 6A to 9B.

An embodiment can be implemented in a referred "Cadence Virtuoso" environment in which a circuit (topology) is represented as a "schematic" as known in the art. The circuit can be a "leaf cell," i.e., a circuit module that is reiterated tens or hundreds of times to form part of a larger circuit. For example, the leaf cell can be a memory cell of a memory circuit having thousands of memory cells. The leaf cell schematic can include input and output pins, interconnected transistors, capacitances and/or resistors. The Virtuoso framework allows parameters to be attached to any object (instances, nets, and the like) in the schematic. To implement "scalable schematics" as described in the present disclosure, additional parameters are added to transistors, resistors and/or capacitances.

By way of example, the connection resistance to a transistor (i.e., its "device connection resistance") depends on the physical implementation of the transistor. Two commonly used transistor attributes are "width," which expresses the strength of the transistor, and "number of fingers", which expresses the number subsets into which the width is partitioned.

Figure 6A:
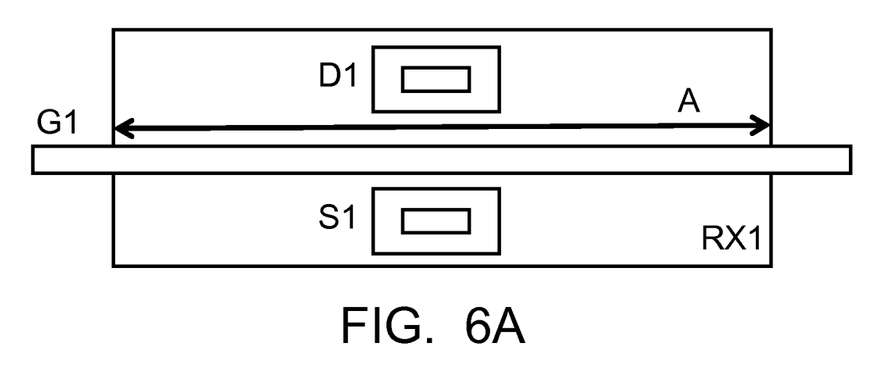
FIG. 6A schematically shows a layout of a transistor.
Figure 6B:
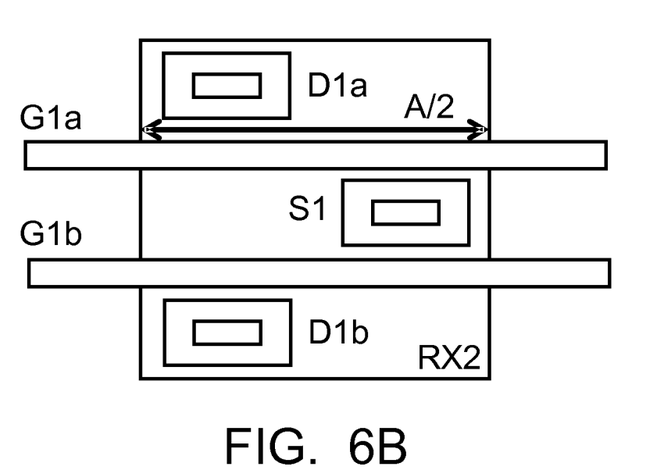
FIG. 6B schematically shows an alternative layout of the transistor of FIG. 6A.

FIG. 6A schematically shows a layout of a transistor, i.e., a transistor T1 with a polysilicon area RX1, source S1, drain D1 and a gate G1. The width of the transistor is given by the length of the gate G1 that intersects the RX1 area. T1 has one gate "finger" resulting in a width A. FIG. 6B schematically shows an alternative layout of the transistor of FIG. 6A, i.e., a transistor T2 with a polysilicon area RX2, source S1, partitioned drain D1$a$ and D1$b$ and a partitioned gate G1$a$ and G1$b$. T2 has two gate "fingers" of width A/2. The gate thus has an effective width of 2*A/2=A, i.e., the same width as T1.

Since the drain can now be connected at two locations, the "device connection resistance" of T2 is less than, namely half, the "device connection resistance" of T1. However, since different metal layers are used to connect to the transistor pins, this also contributes to the overall connection resistance.

Figure 6C:
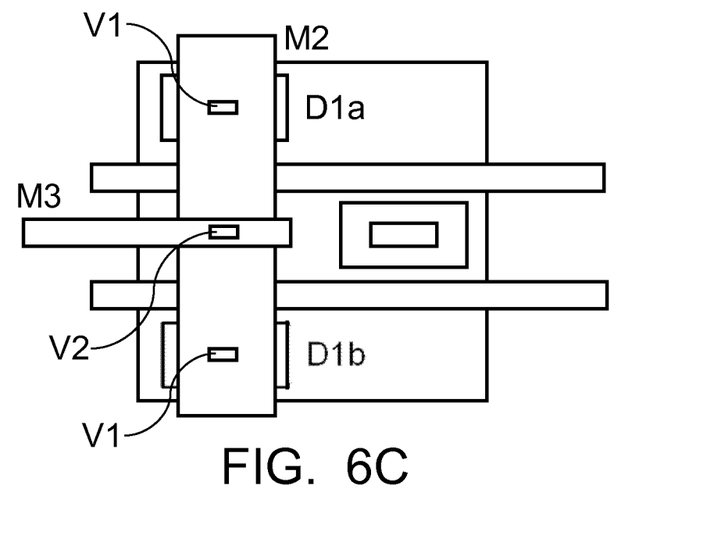
FIG. 6C schematically shows further features of the transistor of FIG. 6B.

FIG. 6C schematically shows further features of the transistor of FIG. 6B, in particular the so-called vias used to interconnect elements in the various metal layers. As is readily apparent from FIG. 6C, the "via resistance" of any transistor depends on how many metal layers are involved in the connection resulting in different number of vias used. Neglecting the metal resistance in view of the dominant "via resistance", the overall "contact resistance" $R_{connection}$ of a transistor can be calculated as $$R_{connection} = R_{device} + R_{vias}$$

where $R_{device}$ is the "device connection resistance" and $R_{vias}$ is the "via resistance."

Since the "device connection resistance" depends on transistor attributes (number-Of-Fingers) and the corresponding transistor pin (source/drain/gate) and the "via resistance" depends on what layers are involved, in an embodiment two properties can be introduced to resistors, namely the properties "related-Transistor-Pin" and "connecting-Metal."

The parameter "relatedTransistorPin" serves to identify the related transistor and transistor pin for calculating the number of "connection spots." From the number of connection spots, the "device connection resistance" can be calculated by $$R_{device} = R_{single}/\text{numberOfSpots}$$

where $R_{single}$ is the resistance of a single connection from metal M1 (a first metal layer) to either source, drain or gate.

The parameters "connectingMetal" and "relatedTransistorPin" are used to calculate the number of vias V1 (vias between M1 and M2, a second metal layer, since each connection spot has an M1 island and needs to hook up to M2; see FIG. 6C). The effective via resistance for V1 can be calculated as $$R_{via1} = R_{V1}/\text{number-Of-Spots,}$$

where $R_{V1}$ is the resistance for a single V1 via.

For the next metal level connections it is assumed that a single via connects from Mn=>Mn+1. The effective via resistance for $V_n$ can be calculated as $$R_{vian} = R_{Vn}$$

where $R_{Vn}$ is the resistance for a single $V_n$ via.

The overall connection resistance thus can be calculated as $$R_{connection} = R_{device} + R_{via1} + \text{SUM}(2 \ldots nR_{Vn})$$

where n is the number of layers indicated by the property "connectingMetal."

Figure 7:
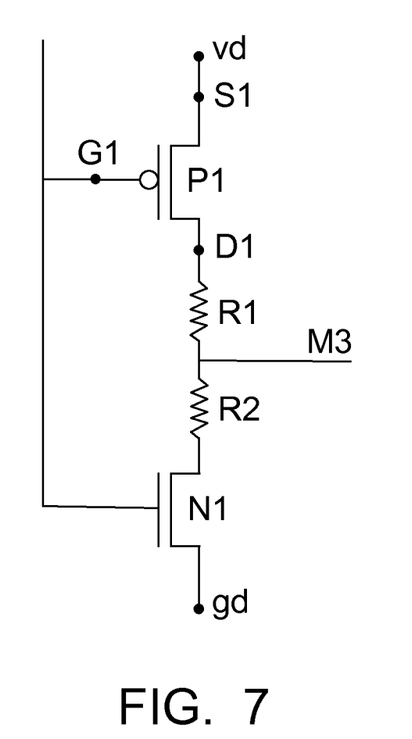
FIG. 7 shows a schematic of a circuit.

FIG. 7 shows a schematic of a circuit, namely of an exemplary leaf cell circuit. The techniques described above with reference to FIGS. 6A to 6C will now be reviewed using the circuit of FIG. 7 as a concrete example.

In the illustrated circuit, resistor R1 is connected to the drain D1 of transistor P1 that has two fingers. Since the connection to a transistor could be ambiguous, the parameter "relatedTransistorPin" is set to "P1:drain." The parameter "connectingMetal" is set to "M3," which designates that the highest metal for the connection is the third layer metal.

During scaling of the transistor P1, in one embodiment, the resistance R1 can be recalculated as follows:

Search through all resistors in the given schematic for a reference to transistor P1. In the illustrated example, this results in R1 being found;

If a reference is found, detect the defined pin. In the illustrated example, this step yields "drain" as a result;
Based on the number of fingers (2), calculate the number of connection spots for the drain (FIG. 6C);
Taking into account the number of connection spots and highest level metal given by "connectingMetal," calculate the absolute connection resistance using the aforementioned equation for $R_{connection}$.
Update the Resistance Value for Resistor R1.

Figure 8:
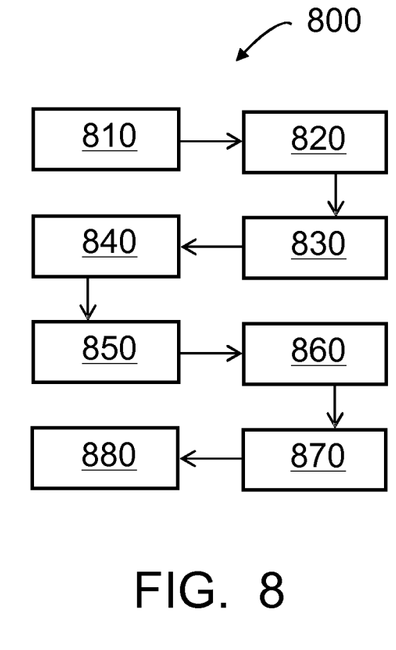
FIG. 8 schematically shows a flow diagram of another embodiment of a data processing method in accordance with the present disclosure.

FIG. 8 shows a schematic of a flow diagram 800 of another embodiment of a data processing method. More specifically, FIG. 8 shows an embodiment in which a "standard" schematic (e.g., as shown in FIG. 7) is converted (e.g., as described above with reference to FIGS. 6A to 6C) into a "scalable" schematic, i.e., into a data structure including both data representative of a schematic of a circuit and data representative of one or more scaling rules for scaling the circuit.

In the embodiment, flow diagram 800 includes a step 810 of receiving a standard schematic, a step 820 of creating a CDF database and adding a global scaling parameter, pload=100, a step 830 of replacing fixed values of transistors with CDF parameters having a corresponding default value, a step 840 of adding instance properties to all transistors that control the scaling behavior, a step 850 of replacing fixed values of resistors with CDF parameters having corresponding default values, a step 860 of adding instance properties to all resistors that control the scaling behavior, a step 870 of replacing fixed values of capacitors with CDF parameters and a step 880 of creating a file that contains corresponding capacitances per capacitor for a default pload.

The embodiment shown in FIG. 8 can also be described as follows. As a first step, a Cadence CDF ("Component Description Format") database is created for a given cell that contains the schematic. A global scaling parameter "pload" is added as a CDF parameter to the database having a default value of 100. The schematic can be a network of interconnected transistors. Capacitances and resistors can be added to the schematic to improve modeling accuracy. The schematic is translated into a scalable schematic by executing e.g., a SKILL script (SKILL is an extension language of the "Cadence Virtuoso" environment for automating tasks) that will operate on the schematic database. The schematic database holds a list of elements in a disembodied property list (DPL, like a relational database).

In a first step of the script, all transistors within the instance list are processed. Each transistor ("instance") typically has two primary attributes, namely "width" (strength of the transistor) and "number-Of-Fingers," having a fixed value. For each transistor, the fixed values are replaced by a CDF parameter having a corresponding default value and are labeled by the instance in the schematic in addition to a prefix "pw_" for the width and "pnf_" for the number-Of-Fingers. In order to control the behavior during scaling, "instance properties" such as lowerBound, minSize, maxSize, equation, and the like are added to each transistor instance.

In the next step of the script, all resistors within the instance list are processed. In an embodiment, resistors can be used to model a connection resistance to a transistor pin. Resistors usually have one attribute, namely "resistance," having a fixed value. The fixed value is replaced by a CDF parameter having a corresponding default value and receives the name of the instance in the schematic in addition to a prefix "pr_". "Instance properties" such as relatedTransistorPin, connectingMetal, and the like are added to each resistor instance. Resistors can be excluded from scaling by setting the relatedTransistorPin to "None." If the relatedTransistorPin is set to a valid transistor pin, the resistance can be calculated as described above with respect to FIGS. 6A to 6C.

In a later step of the script, all capacitors within the instance list are processed. In an embodiment, capacitors can be used to model wiring capacitances resulting from transistor interconnections. Capacitors usually have one attribute, namely "capacitance," having a fixed value. The fixed value is replaced by a CDF parameter and receives the name of the instance in the schematic in addition to a prefix "pc_". A (capacitance definition) file is created that contains a single line per capacitor in the format <instance> <pload> <capValue> with capValue having a corresponding default value. Such pairs of pload and capValue can be extended (manually) to <instance> <pload1> <capValue1> <pload2> <capValue2> . . . to represent a non-linear capacitance, e.g., as exemplified by the following table (the arrow designating the entry with more than one pload and capValue pair):

TABLE 1

|  | pw_12 | 100 | 1.5 u | | |
|---|---|---|---|---|---|
|  | pw_cklin | 100 | 1.4 u | | |
|  | pw_d | 100 | 3.5 u | | |
| ---> | pw_d_b | 100 | 1.0 | 200 | 1.5 u |
|  | pw_din1 | 100 | 1.4 u | | |
|  | pw_fbk | 100 | 1.4 u | | |
|  | pw_reset_b | 100 | 1.4 u | | |
|  | pw_w0 | 100 | 0.35 u | | |
|  | pw_w2 | 100 | 0.35 u | | |
|  | pw_w3 | 100 | 0.7 u | | |

In such cases, a piecewise linear interpolation is applied to calculate the non-linear capacitance as described below with respect to FIG. 9B.

In the following, the scaling of a capacitance will be described with reference to FIGS. 9A and 9B.

Figure 9A:
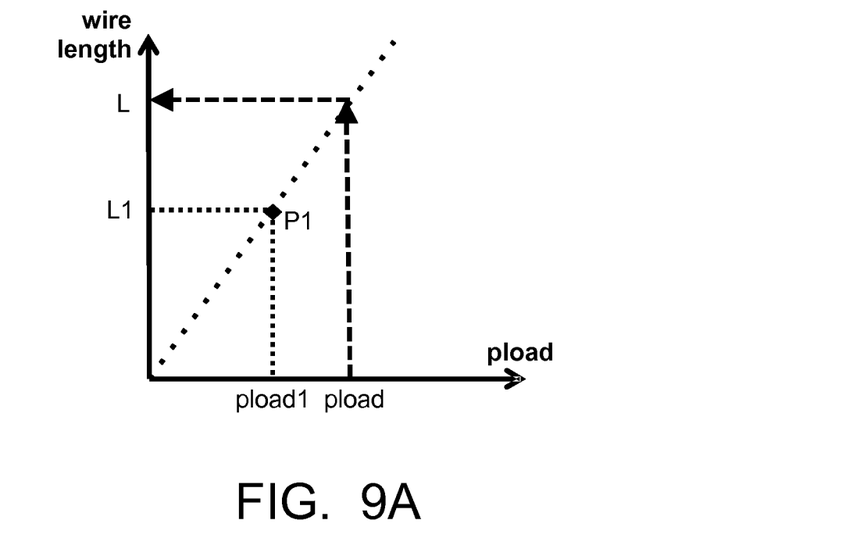
FIG. 9A schematically depicts the characteristics of a capacitance.

FIG. 9A schematically depicts the characteristics of a capacitance exhibiting linear behavior.

Figure 9B:
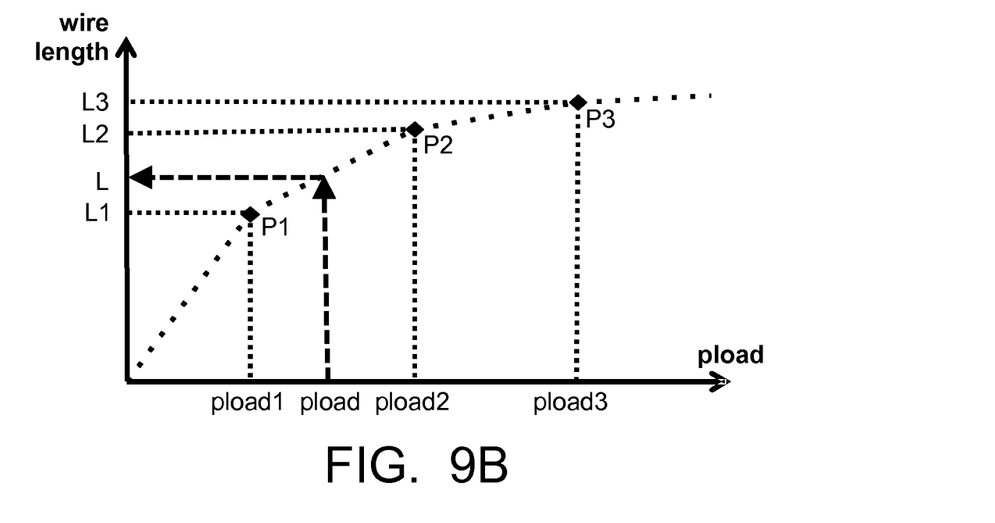
FIG. 9B schematically depicts the characteristics of another capacitance.

FIG. 9B schematically depicts the characteristics of another capacitance exhibiting non-linear behavior.

A capacitance can be an inherent element of a circuit, e.g., a capacitance arising from interaction of a length of wire with a circuit substrate, or a designed element of the circuit, i.e., a distinct circuit element. As such, a capacitance can be characterized by a parameter wire representative of the length of a length of wire or by parameter C_gnd representative of a distinct capacitance, e.g., in Farad or µF. As exemplified by Table 1 above, the electrical characteristics of a capacitance can be represented by a table of value pairs. As exemplified by FIG. 9A, a single value pair can represent a linear characteristic. As illustrated by FIG. 9B, a plurality of value pairs can represent a non-linear characteristic. As illustrative by FIGS. 9A and 9B, t capacitance value of the capacitance at a given value of pload (i.e., at a given scaling factor) can be obtained by first order approximation, i.e., by (piecewise) linear interpolation, using the value pair(s).

As will be appreciated by one skilled in the art, aspects of the present disclosure can be embodied as a system, method or computer program product. Accordingly, aspects of the present disclosure can take the form of an entirely hardware embodiment, an entirely software embodiment (including firmware, resident software, micro-code, and the like) or an embodiment combining software and hardware aspects that can all generally be referred to herein as a "circuit," "module" or "system." Furthermore, aspects of the can take the form of a computer program product embodied in one or more computer readable medium(s) having computer readable program code embodied thereon.

Any combination of one or more computer readable medium(s) can be utilized. The computer readable medium can be a computer readable signal medium or a computer readable storage medium. A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

A computer readable signal medium can include a propagated data signal with computer readable program code embodied therein, for example, in baseband or as part of a carrier wave. Such a propagated signal can take any of a variety of forms, including, but not limited to, electromagnetic, optical, or any suitable combination thereof. A computer readable signal medium can be any computer readable medium that is not a computer readable storage medium and that can communicate, propagate, or transport a program for use by or in connection with an instruction execution system, apparatus, or device.

Program code embodied on a computer readable medium can be transmitted using any appropriate medium, including but not limited to wireless, wireline, optical fiber cable, RF, and the like, or any suitable combination of the foregoing.

Computer program code for carrying out operations for aspects of the present invention can be written in any combination of one or more programming languages, including an object oriented programming language such as Java, Smalltalk, C++ or the like and conventional procedural programming languages, such as the "C" programming language or similar programming languages. The program code can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider).

Aspects of the present disclosure are described with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions can also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The block diagrams in the figures illustrate the architecture, functionality, and operation of possible implementations of systems, methods and computer program products according to various embodiments of the present disclosure. In this regard, each block in the block diagrams can represent a module, segment, or portion of code, which includes one or more executable instructions for implementing the specified logical function(s). It should also be noted that, in some alternative implementations, the functions previously described can occur out of the disclosed order. For example, two functions taught in succession can, in fact, be executed substantially concurrently, or the functions can sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

In the present disclosure, the term "receiving" can include receiving/obtaining the respective data/information from a storage medium, via a computer network and/or by user input. In the present disclosure, any "receiving" can be accompanied by a "storing" of the received data/information, e.g., in a computer memory, on a hard disk, in a flash storage device or in any other storage device. In other words, where the method includes a receiving of the data/information, the method can include a storing of the received data/information. This applies mutatis mutandis for the term "retrieving."

The corresponding structures, materials, acts, and equivalents of all means or step plus function elements in the claims below are intended to include any structure, material, or act for performing the function in combination with other claimed elements as specifically claimed. The description of the present invention has been presented for illustrative purposes, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of modifying a topology representation of a circuit, said topology representation comprising a list of circuit elements, which are interconnected, wherein each of said circuit elements has a predetermined number of attributes related to a manufacturing process of integrated circuits, said method comprising:
  employing a computer for using data representing a circuit schematic for each of said circuit elements; and
  replacing at least one of said predetermined number of attributes specifying a scaling rule of said circuit,
  wherein said scaling rule specifies said replaced at least one of said predetermined number of attributes depending on a scale of said manufacturing process;
  wherein said circuit elements comprise transistors, resistors and capacitors, wherein said number of attributes of a transistor comprises a width of a gate channel and its number of interconnects, and wherein said number of attributes of said resistor comprises its resistance, and wherein the number of attributes of a capacitor comprises its capacitance; and
  wherein said scaling rule comprises a scaling rule for said capacitance as a function of a load, a scaling rule for a resistance as a function of said transistor, a scaling rule for said transistor as a function of said resistance and a scaling rule for said transistor as a function of another transistor of said transistors.

2. The method of claim 1, wherein said scaling rule specifies a gate channel width of said transistor as a function of a gate channel width of another transistor of said transistors, wherein said scaling rule specifies a capacitance of a wire as a function of said gate channel width of said transistor, and wherein said scaling rule specifies a capacitance of a wire as a function of a load, and wherein said scaling rule specifies either a minimum or a maximum transistor size.

3. The method of claim 2, wherein said scaling rule for said transistor comprises at least one of default values, lower bound, minimum size, maximum size, equations, and wherein said scaling rule for a resistor comprises at least one of related transistor pins, connecting metal, and wherein said scaling rule for a capacitor comprises at least one of default values, table values representing linear or non-linear capacitance.

4. The method of claim 3, wherein a scaling factor is added to said topology representation, said scaling factor specifying at least one of a width of a gate channel of a group of said transistors, an area of a drain diffusion zone of said transistor, grids of wires of a metalized layer.

5. The method of claim 4, wherein a table of values comprises pairs of values, a first value of a pair of values specifying a concrete value of said scaling factor, and a second value of said pair of values specifying a corresponding capacitance.

6. The method of claim 3, wherein said scaling rule for a capacitor further comprise a parameter representing a length of a wire or of a capacitance.

* * * * *